United States Patent
Motoyama

(10) Patent No.: US 6,900,539 B2
(45) Date of Patent: May 31, 2005

(54) SEMICONDUCTOR DEVICE AND METHOD FOR MANUFACTURING THE SAME

(75) Inventor: Koichi Motoyama, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/271,727

(22) Filed: Oct. 17, 2002

(65) Prior Publication Data

US 2003/0075752 A1 Apr. 24, 2003

(30) Foreign Application Priority Data

Oct. 19, 2001 (JP) ........................................ 2001-321287

(51) Int. Cl.[7] .............................................. H01L 23/48
(52) U.S. Cl. ...................... 257/751; 257/753; 257/758; 257/767; 257/762; 257/764
(58) Field of Search .............................. 257/751–753, 257/758, 767, 761–764, 915

(56) References Cited

U.S. PATENT DOCUMENTS

| | | | |
|---|---|---|---|
| 5,985,762 A | * | 11/1999 | Geffken et al. ............. 438/687 |
| 6,358,842 B1 | * | 3/2002 | Zhou et al. .................. 438/633 |
| 6,417,094 B1 | * | 7/2002 | Zhao et al. .................. 438/627 |
| 6,498,091 B1 | * | 12/2002 | Chen et al. .................. 438/627 |
| 6,531,780 B1 | * | 3/2003 | Woo et al. ................... 257/758 |
| 6,576,982 B1 | * | 6/2003 | You et al. .................... 257/639 |
| 6,624,066 B2 | * | 9/2003 | Lu et al. ...................... 438/643 |
| 2003/0075752 A1 | * | 4/2003 | Motoyama ................... 257/306 |

FOREIGN PATENT DOCUMENTS

| | | |
|---|---|---|
| JP | 04-127527 | 4/1992 |
| JP | 10-284603 | 10/1998 |
| JP | 10-340865 | 12/1998 |
| JP | 11-307530 | 11/1999 |
| JP | 2000-91425 | 3/2000 |
| JP | 2000-323571 | 11/2000 |
| JP | 2001-53077 | 2/2001 |
| JP | 2001-176965 | 6/2001 |

* cited by examiner

*Primary Examiner*—Mark V. Prenty
(74) *Attorney, Agent, or Firm*—Young & Thompson

(57) ABSTRACT

A semiconductor device comprises a first Cu interconnect layer, an interlayer insulation film formed thereon, a via hole formed in the interlayer insulation film to expose a part of the first Cu interconnect layer and a Cu via formed within the via hole and connected to the first Cu interconnect layer. A TaN barrier film and a Ta barrier film are laminated on the side surface of the Cu via, and only the Ta barrier film is formed under the bottom surface thereof. The adherence between the TaN barrier film and the interlayer insulation film is strong, and the adherence between the Ta barrier film and copper is strong. Both the barrier films prevent Cu contamination due to diffusion of Cu and at the same time, enhance adherence between Cu and the interlayer insulation film at the side surface of the Cu via to prevent removal of the Cu via.

12 Claims, 15 Drawing Sheets

SEMICONDUCTOR DEVICE AND METHOD FOR MANUFACTURING THE SAME

BACKGROUND OF THE INVENTION

1. Technical Field of the Invention

The present invention relates to a semiconductor device employing multi-layer interconnects therein, and more particularly to a semiconductor device having via holes/metals improved in terms of reliability therein for connecting upper and lower interconnect layers to each other, and further a method for manufacturing the same.

2. Description of the Related Art

Recently, in accordance with miniaturization and high integration of a semiconductor device, copper or copper alloy (hereinafter, name them generically as copper) has increasingly been employed as an interconnect material because copper has a lower resistance than that could be achieved by employing aluminum. In a case where a semiconductor device having multi-layer interconnects formed therein and employing copper as an interconnect material, for example, upper and lower interconnect layers each are formed of copper and a via metal for connecting upper and lower interconnect layers to each other is also formed of copper. However, when an interconnect layer and a via metal are formed of copper, there will be a tendency for the copper atoms of a certain interconnect to diffuse through an interlayer insulation film made of a silicon oxide or the like and to be recrystallized at around an interface between the interlayer insulation film and an adjacent interconnect just next to the certain interconnect, thereby causing a short circuit between the certain interconnect and the adjacent interconnect. Or, there will be a tendency for the copper atoms of a certain interconnect to diffuse into an impurity layer constituting an element, which is formed in a silicon substrate and positioned directly below the certain interconnect, and to impart damage to the element, whereby the certain interconnect substantially deteriorates the element's performance. In order to prevent such an unfavorable situation where copper deteriorates the performance of semiconductor device, in other words, so-called copper contamination, conventionally a barrier film has been formed at an interface where copper part and an interlayer insulation film are contact with each other to prevent diffusion of copper.

For example, Japanese Patent Application Laid-open No. 4(1992)-127527 discloses a technique in which a single layer film made of tantalum (Ta) is employed as such kind of barrier film. Furthermore, Japanese Patent Application Laid-open No. 2001-176965 discloses a technique in which a single layer film made of tantalum nitride (TaN) is employed as a barrier film. However, in the former technique, the following problem is found. That is, although tantalum is adherently bonded to copper, it is weakly bonded to an interlayer insulation film and therefore, copper interconnects layer and a tantalum barrier film are removed from the interlayer insulation film in a process step such as a CMP (Chemical Mechanical Polishing) step that is employed to form damascene interconnects. Moreover, in the latter technique, although tantalum nitride (TaN) is adherently bonded to an interlayer insulation film, it is weakly bonded to copper and therefore, a copper interconnect layer is unfavorably removed from a tantalum nitride barrier film at an interface therebetween in a CMP step.

In order to solve such problems found in the conventional techniques, a technique in which a barrier film having a laminated structure is proposed. For example, Japanese Patent Application Laid-open No. 11(1999)-307530 discloses a technique in which tantalum or an amorphous metal containing tantalum is formed between a barrier film and a copper interconnect layer to enhance adherence between copper and tantalum nitride in a case where a refractory metal consisting of a tantalum metal such as TaSiN (tantalum silicon nitride) or TaN is employed as a barrier film.

An example including multi-layer interconnects structure therein that employs a laminated barrier film consisting of Ta and TaN will be explained with reference to FIGS. 1A through 1D. The example has a dual damascene structure in which an upper interconnect layer and a via metal are simultaneously formed in an interlayer insulation film while having one-piece structure. First, as shown in FIG. 1A, a silicon substrate 201 is previously constructed such that a region of the substrate, which region is surrounded by an element isolation insulating film 203, has a specific element 202 formed therein and consisting of a gate electrode 205, an impurity layer 206 and the like. Furthermore, on a surface of the substrate 201 are formed a first interlayer insulation film 207 and in the first interlayer insulation film 207 is formed an element contact 209 made of W (tungsten) and electrically connected to the impurity layer 206. After forming a second interlayer insulation film 210 made of a silicon oxide on the first interlayer insulation film 207, a first interconnect trench 211 is formed by a photolithography technique such that a specific region of the second interlayer insulation film 210 is removed over its entire film thickness and a TaN (tantalum nitride) barrier film 213 and a Ta (tantalum) barrier film 214 are sequentially deposited by a sputtering method on an entire surface of the substrate, and further a Cu seed film 215 is deposited by a sputtering method thereon. Then, a Cu plating film 216 is formed by a plating method on an entire surface of the substrate with the aid of the Cu seed film 215 to fill the first interconnect trench 211 with the Cu plating film 216.

Thereafter, as shown in FIG. 1B, the Cu plating film 216, the Ta barrier film 214 and the TaN barrier film 213 are polished back by a CMP (Chemical Mechanical Polishing) method to flatten the surface of the substrate, thereby forming a first Cu interconnect layer 212 as a first interconnect layer.

Subsequently, as shown in FIG. 1C, a third interlayer insulation film 220 made of a silicon oxide is formed on the second interlayer insulation film 210 and a second interconnect trench 221 having a specific pattern and a predetermined depth from the surface of the third interlayer insulation film 220 is formed in the third interlayer insulation film 220 by a photolithography technique. Furthermore, a via hole 222 is formed in one or more portions of the bottom surface of the second interconnect trench 221 thus formed to thereby expose the surface of the first interconnect layer 212. Then, a TaN barrier film 225 and a Ta barrier film 226 are sequentially deposited by a sputtering method and further, a Cu seed film 227 is deposited thereon by a sputtering method. Thereafter, a Cu plating film 228 is formed by a plating method on an entire surface of the substrate with the aid of the Cu seed film 227 to thereby fill the second interconnect trench 221 and the via hole 222 with the Cu plating film 228. After that, as shown in FIG. 1D, the Cu plating film 228, the Ta barrier film 226 and the TaN barrier film 225 are polished back by a CMP method to flatten the surface of the substrate, thereby forming a second Cu interconnect layer 223 and a Cu via 224 as a second interconnect layer.

As described above, multi-layer interconnects having a so-called dual damascene structure is realized by employing Cu to form the first interconnect layer, the second interconnect layer and the via metal. However, in the configuration of multi-layer interconnects, a laminated barrier film consisting of TaN and Ta is formed at an interface between Cu and an interlayer insulation film and therefore, diffusion of Cu atoms into the interlayer insulation film can be prevented, and as a result, Cu contamination observed in a situation where diffusion of Cu into an adjacent interconnect layer and/or an element, both being located next to a certain interconnect layer in problem, causes short circuit between interconnect layers and/or deterioration in the element's performance can also be prevented. In addition, since Ta is adherently bonded to both Cu and TaN, disposing Ta between Cu and TaN resultantly improves adherence between Cu and TaN, as well as adherence between Cu and an interlayer insulation film. This construction of multi-layer interconnects solves the following drawbacks found in the conventional technique. That is, when polishing a surface of the substrate to flatten the surface thereof by using the above-mentioned CMP method, polishing slurry enters an interface between Cu and an interlayer insulation film to deteriorate adherence therebetween and mechanical stress imparted to Cu and the interlayer insulation film during polishing operation deteriorate adherence therebetween to thereby remove a Cu interconnect layer from the interlayer insulation film.

As described above, forming a laminated barrier film consisting of Ta and TaN at an interface between an interlayer insulation film and Cu makes it possible to effectively prevent diffusion and removal of Cu. However, it should be noted here that when focusing on a Cu via 224, which is shown in FIGS. 1A through 1D and has such laminated barrier film thereunder, the first interconnect layer, i.e., the first Cu interconnect layer 212, formed under the Cu via 224 and facing the bottom surface of the Cu via 224 is constructed such that the TaN barrier film 225 is formed on and in contact with the upper surface of the first Cu interconnect layer 212. As is already mentioned, the TaN barrier film 225 is weakly bonded to Cu and therefore, when passing a current from the second Cu interconnect layer 223 through the Cu via 224 to the first Cu interconnect layer 212, electro-migration occurs at an interface between Cu of the first Cu interconnect layer 212 and the TaN barrier film 225 in the following manner. That is, Cu atoms existing in the upper portion of the first Cu interconnect layer 212 move along an interface between the first Cu interconnect layer 212 and the TaN barrier film 225 to the other area while removing Cu existing in the surface portion of the first Cu interconnect layer 212 and located under the bottom surface of the Cu via 224, in other words, producing voids in the surface portion thereof, resulting in loss of adherence between the TaN barrier film 225 and the first Cu interconnect layer 212 and increase in contact resistance therebetween. In addition, thermal stress imparted to the multi-layer interconnects during manufacturing steps also deteriorates adherence between the first Cu interconnect layer 212 and the TaN barrier film 225 at an interface therebetween to thereby increase contact resistance therebetween.

SUMMARY OF THE INVENTION

An object of the present invention is to provide a semiconductor device capable of improving adherence between a Cu via and a lower interconnect layer formed thereunder to reduce contact resistance therebetween, and at the same time, preventing Cu contamination, and further, to provide a method for manufacturing the same.

A semiconductor device according to the present invention comprises a lower Cu interconnect layer formed of Cu (Cu or Cu alloy), an interlayer insulation film covering the lower Cu interconnect layer, a via hole formed in the interlayer insulation film to expose a part of the lower Cu interconnect layer and a Cu via made of copper formed within the via hole and connected to the lower Cu interconnect layer. The semiconductor device constructed as described above further comprises a first barrier film and a second barrier film, in which both barrier films are formed on a side surface of the copper via and laminated relatively to each other. The adherence between the first barrier film and the interlayer insulation film is strong, and the adherence between the second barrier film and copper is strong. The second barrier film is formed under a bottom surface of the copper via while the first barrier film is not.

Furthermore, when applying the present invention to a dual darnascene structure, a preferred and exemplified semiconductor device employing the dual damascene structure is constructed as follows. That is, the semiconductor device comprises, an upper interconnect trench formed in the interlayer insulation film on the copper via and an upper Cu interconnect layer made of copper formed within ,the upper interconnect trench, in which the upper Cu interconnect layer and the copper via form one-piece structure, the upper Cu interconnect layer and the lower Cu interconnect layer are connected together through the copper via, only the second barrier film is formed in a connection region for connecting the lower Cu interconnect layer and the copper via together, and the first and second barrier films are being laminated in a contact region for making the interlayer insulation film and a copper region consisting of the upper Cu interconnect layer and the copper via contact each other, the contact region being defined as a region other than the connection region.

Furthermore, a method for manufacturing a semiconductor device according to the present invention comprises the steps of forming a via hole in an interlayer insulation film formed on a lower Cu interconnect layer made of copper to expose a part of the lower Cu interconnect layer, depositing a first barrier film on an inner surface of the via hole, the adherence between the first barrier film and the interlayer insulation film being strong, etching the first barrier film to remove the first barrier film positioned at a bottom surface of the via hole, depositing a second barrier film on an inner surface of the via hole, the adherence between the second barrier film and copper being strong, and forming copper within the via hole to form a copper via.

Moreover, when applying the present invention to a dual damascene structure, a preferred and exemplified method for manufacturing a semiconductor device employing the dual damascene structure is constructed as follows. That is, the method for manufacturing a semiconductor device comprises the steps of forming an upper interconnect trench to a specific depth in an interlayer insulation film formed on a lower Cu interconnect layer made of copper and further, partially opening the interlayer insulation film positioned under the upper Cu interconnect trench to form a via hole therein for exposing a part of the lower Cu interconnect layer, depositing a first barrier film respectively on inner surfaces of the upper Cu interconnect trench and the via hole, the first barrier film being characterized in that adherence between the first barrier film and the interlayer insulation film is strong, etching the first barrier film to remove the first barrier film positioned at a bottom surface of the via hole, depositing a second barrier film respectively on inner surfaces of the upper Cu interconnect trench and the via hole, the second barrier film being characterized in that adherence between the second barrier film and copper is strong, and forming copper within the upper Cu interconnect trench and the via hole to form one-piece structure consisting of the upper Cu interconnect layer and the copper via.

It should be noted that the present invention employs the following process steps in the above-described methods. That is, the via hole is formed to have an aspect ratio ranging from 1.5 to 5 and the first barrier film is deposited by a sputtering method, and the first barrier film is etched until the first barrier film positioned at a bottom surface of the via hole is removed. Alternatively, the present invention employs the following sputtering method of depositing the first barrier film. That is, the first barrier film is deposited such that the first barrier film is rarely deposited on a bottom surface of a via hole of a small dimension. Moreover, the present invention employs the following process steps for forming the Cu via or forming one-piece structure consisting of the upper Cu interconnect layer and the copper via. That is, after depositing copper to a large film thickness in the via hole or the upper Cu interconnect trench, polish copper using a CMP (Chemical Mechanical Polishing) method to make surfaces of the interlayer insulation film and copper constitute a flattened surface.

According to the present invention, a semiconductor device is constructed such that a first barrier film adhesive to an interlayer insulation film and a second barrier film adhesive to Cu are laminated on the side surface of a Cu via, which is provided to connect together lower and upper interconnect layers consisting of Cu, to form a two-layered film, and only the second barrier film as a single layer is formed under the bottom surface of the Cu via. Accordingly, those barrier films prevent Cu contamination of the semiconductor device while enhancing adherence between Cu and the interlayer insulation film at the side surface of the Cu via to prevent removal of the Cu via. Furthermore, since only the second barrier film resides on the bottom surface of the Cu via, adherence between the lower interconnect layer and the Cu via is enhanced to suppress movement of Cu atoms at an interface between the Cu via and the lower interconnect layer, thereby increasing resistance against electro-migration and thermal stress and enabling to obtain multi-layer interconnects structure whose contact resistance is lowered.

DETAILED DESCRIPTION OF THE PREFERRED EMBODIMENTS

Figure 1A:
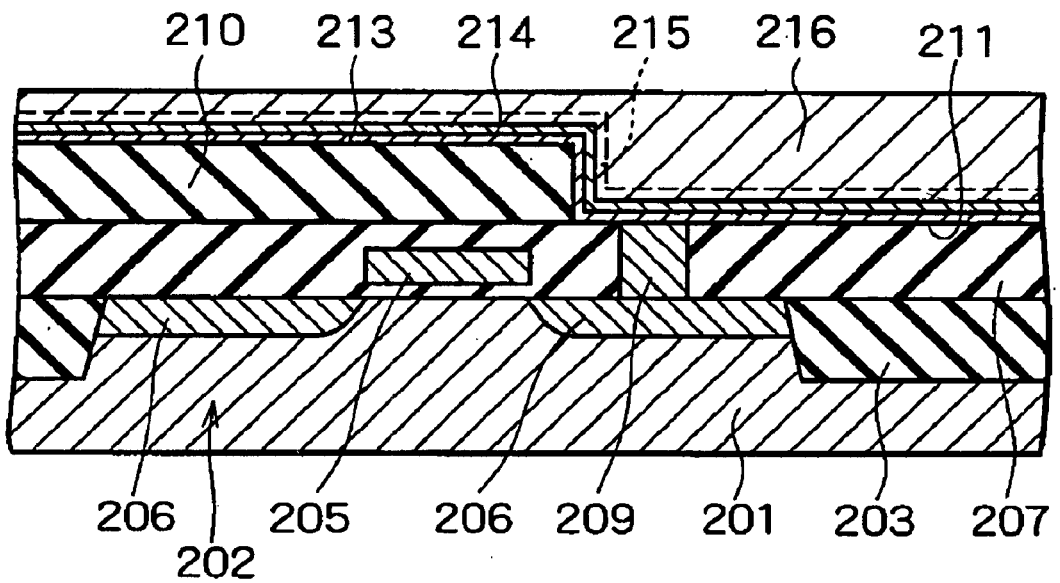
FIGS. 1A through 1D each are cross sectional views of a conventional semiconductor device, illustrating a method for manufacturing the semiconductor device in the order of manufacturing steps.
Figure 1B:
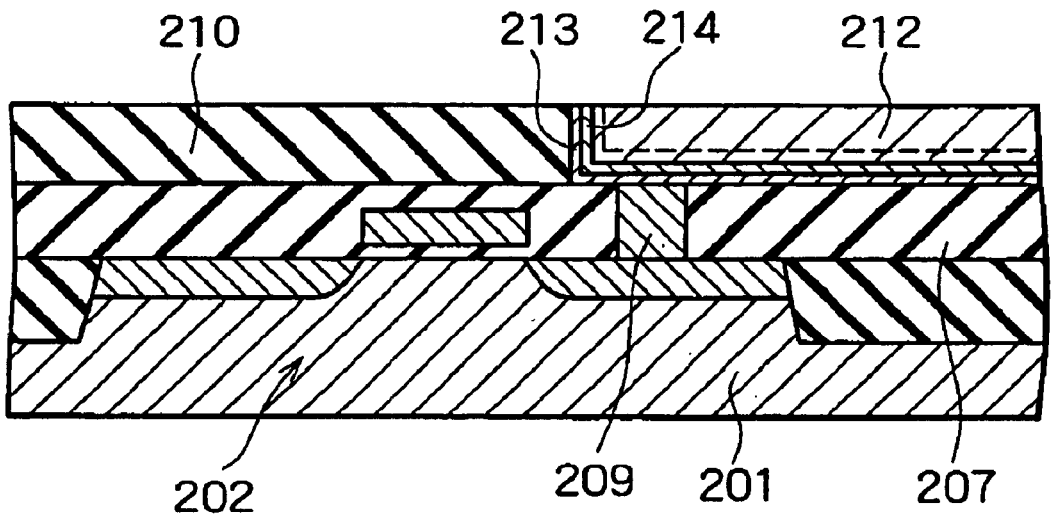
Figure 1C:
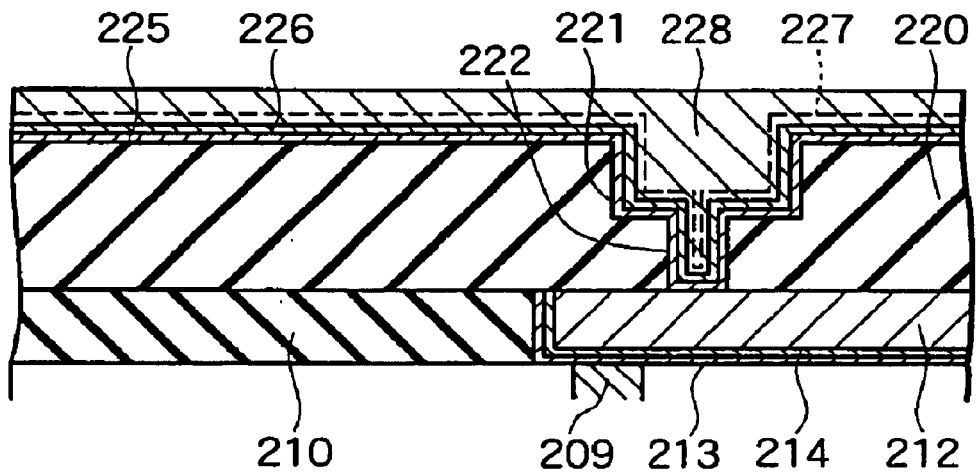
Figure 1D:
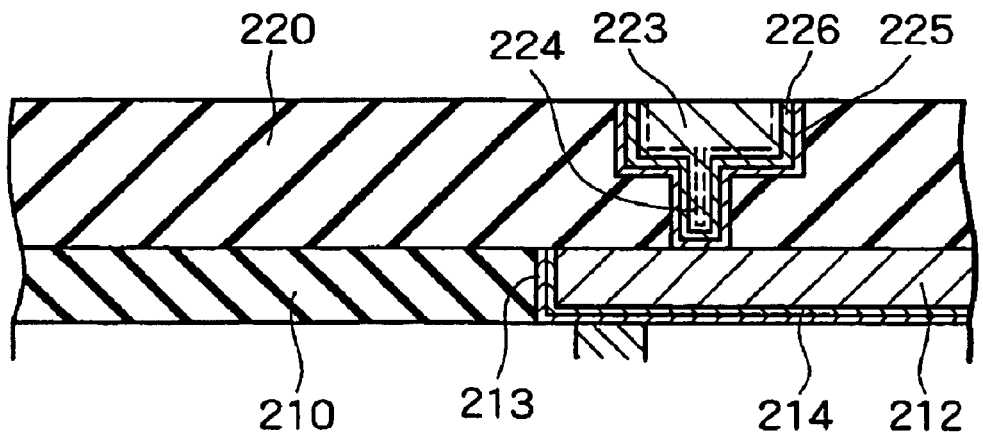
Figure 2A:
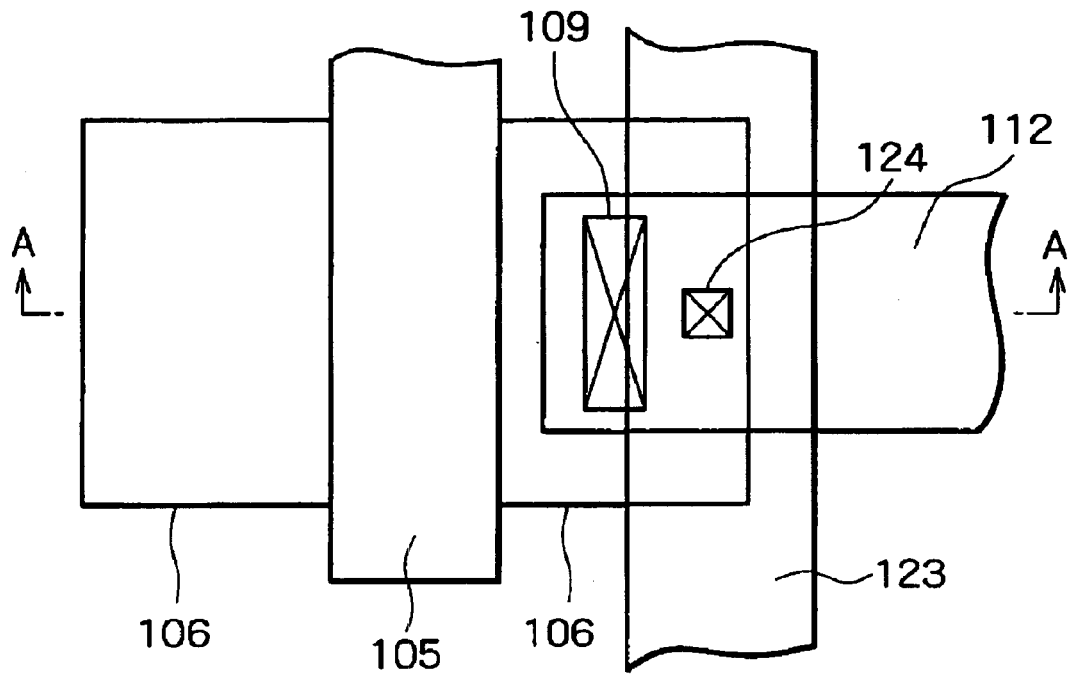
FIG. 2A is a plan view of a semiconductor device of a first embodiment of the present invention and FIG. 2B is a cross sectional view taken along the line A—A shown in FIG. 2A.
Figure 2B:
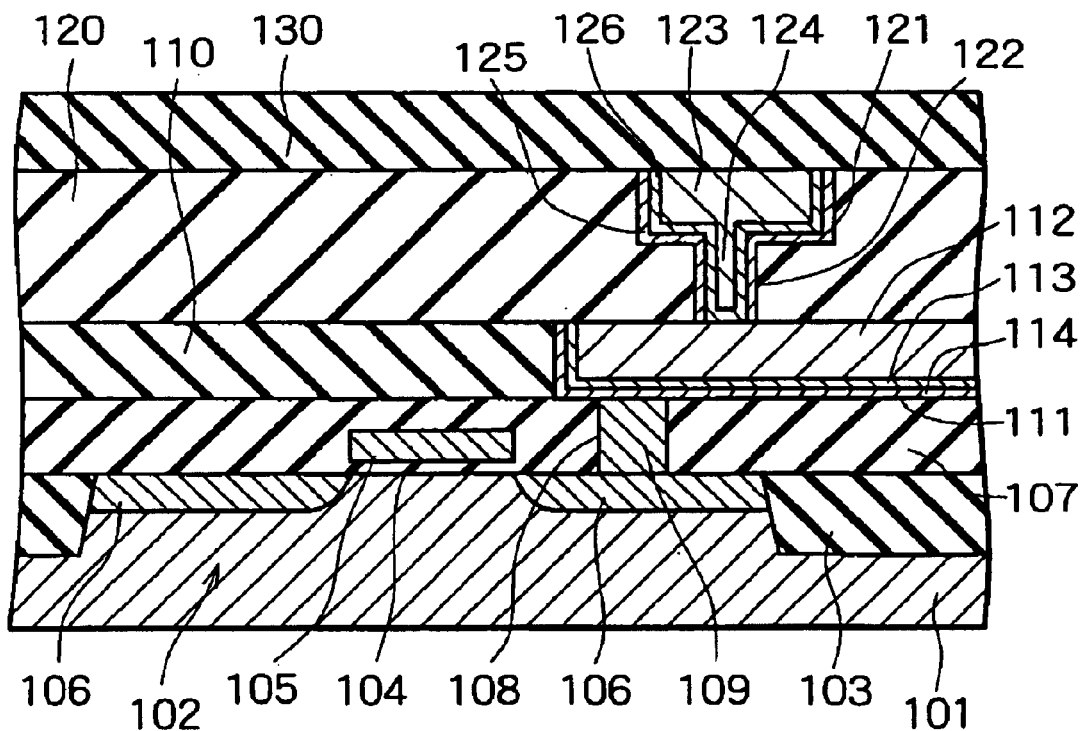

Preferred embodiments of the present invention will be explained with reference to the accompanying drawings. FIG. 2A is a plan view of a dual damascene structure constructed in accordance with a first embodiment of the present invention and FIG. 2B is a cross sectional view taken along the line A—A shown in FIG. 2A. A silicon substrate 101 has an element 102 therein formed in a specific region surrounded by an element isolation insulating film 103. In this embodiment, the element 102 is formed as a MOS transistor comprising a gate insulation film 104 and a gate electrode 105, both of which are formed on the principal surface of the silicon substrate 101, and further, comprising impurity layers 106 as source/drain formed in both regions of the silicon substrate 101, the both regions interposing the gate electrode 105 therebetween. Furthermore, a first interlayer insulation film 107 made of a silicon oxide is formed on the silicon substrate 101, a contact hole 108 is formed in the first interlayer insulation film 107 while passing therethrough to reach the impurity layer 106 and a refractory metal such as W (tungsten) or Ti (titanium) is formed within the contact hole 108 to form an element contact 109 that provides electrical connection between the element 102 and other components.

A second interlayer insulation film 110 made of a silicon oxide and having a film thickness of about 300 nm is formed on the first interlayer insulation film 107, a first interconnect trench 111 having a specific pattern and a film thickness equal to an entire film thickness of the second interlayer insulation film 110 is formed in the second interlayer insulation film 110 and Cu is formed within the first interconnect trench 111 to thereby form a first interconnect layer 112 electrically connected to the element 102 (impurity layer 106) through the element contact 109. The first interconnect layer 112 is being formed within the first interconnect trench 111 in a situation where a TaN barrier film 113 and a Ta barrier film 114 are laminated in this order on an inner surface of the first interconnect trench 111, which configuration prevents diffusion of Cu into the second interlayer insulation film 110 while preventing Cu contamination.

A third interlayer insulation film 120 made of a silicon oxide and having a film thickness of about 600 nm is formed on the second interlayer insulation film 110 and a second interconnect trench 121 having a specific pattern and a depth of about 300 nm below the surface of the third interlayer insulation film 120, which depth is nearly equal to half of the film thickness of third interlayer insulation film 120, is formed in the third interlayer insulation film 120. Furthermore, a via hole 122 having a depth of about 300 nm is formed in one or more portions (the figure illustrates a case where the via hole 122 is formed in one portion) of the bottom surface of the second interconnect trench 121 to thereby expose the surface of the first interconnect layer 112. Then, a TaN barrier film 125 and a Ta barrier film 126 are formed on inner surfaces of the second interconnect trench 121 and the via hole 122, while Cu is formed within the second interconnect trench 121 and the via hole 122, thereby forming a second Cu interconnect layer 123 and a Cu via 124. Note that the TaN barrier film 125 does not reside on the bottom surface of the Cu via 124 and only the Ta barrier film 126 resides on the same.

Additionally, on the third interlayer insulated film 120 is formed a fourth interlayer insulation film 130 that constitutes an uppermost insulation film of the substrate. Alternatively, though not shown, a third interconnect layer similar to the second interconnect layer is formed in the fourth interlayer insulation film and a fifth interlayer insulation film is formed thereon as an uppermost insulation film of the substrate.

Figure 3A:
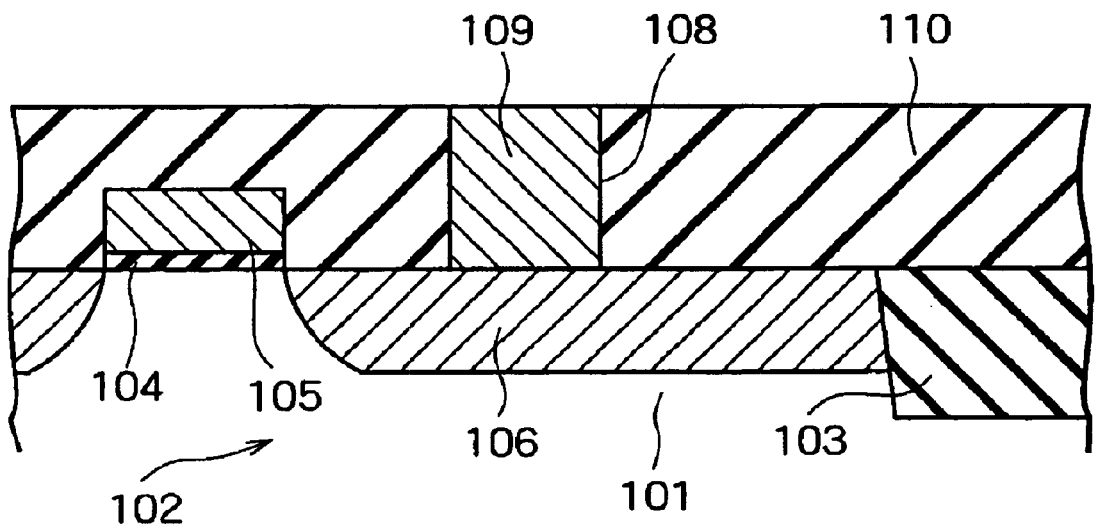
FIGS. 3A through 3I each are cross sectional views of the semiconductor device of the first embodiment, illustrating a method for manufacturing the semiconductor device in the order of manufacturing steps.

A method for manufacturing the semiconductor device constructed in accordance with the embodiment and shown in FIGS. 2A, 2B will be explained with reference to FIGS. 3A through 3I, each illustrating a primary and enlarged cross sectional view of the semiconductor device. First, as shown in FIG. 3A, a first interlayer insulation film 107 made of a silicon oxide is formed to a specific film thickness on a silicon substrate 101, in which an element 102 comprised of a MOS transistor is formed, and a contact hole 108 is formed in the first interlayer insulation film 107 by a photolithography technique employing a photoresist, not shown herein, so as to expose an impurity layer 106. After that, W is deposited on an entire surface of the substrate by a sputtering method so as to fill the contact hole 108 with W and then, a surface of W thus deposited is polished by a CMP method to flatten the surface thereof, thereby making W remain only within the contact hole 108 to form an element contact 109.

Figure 3B:
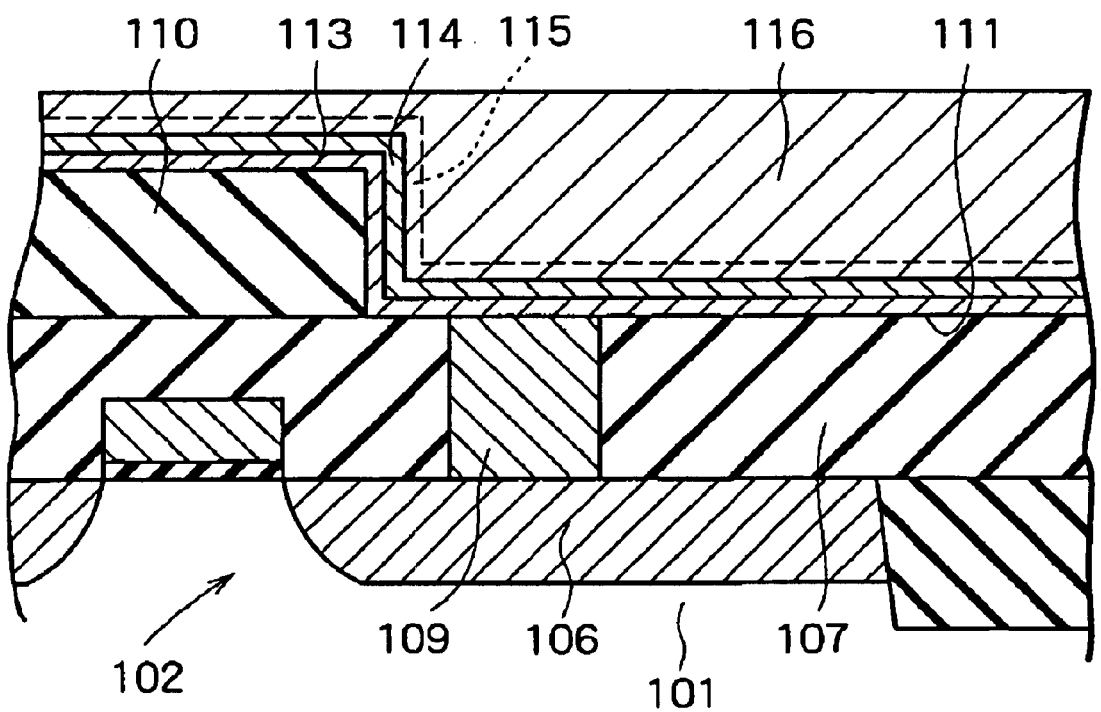

Thereafter, as shown in FIG. 3B, a second interlayer insulation film 110 made of a silicon oxide is formed to a film thickness of about 300 nm and a first interconnect trench 111 having a specific pattern and a depth equal to an entire film thickness of the second interlayer insulation film 110 is formed in the second interlayer insulation film 110 by a photolithography technique employing a photoresist, not shown herein. Subsequently, a TaN barrier film 113 and a Ta barrier film 114 are deposited in this order on an entire surface of the substrate by a sputtering method. Note that each of those barrier films is deposited to a film thickness of about 10 to 20 nm. Furthermore, a Cu seed film 115 denoted by a dashed line in the figure is deposited to an appropriate film thickness by a sputtering method. Then, Cu plating is carried out using a plating method with the aid of the Cu seed film 115 to thereby form a Cu plating film 116, which completely covers at least the first interconnect trench 111, on the Cu seed film 115.

Figure 3C:
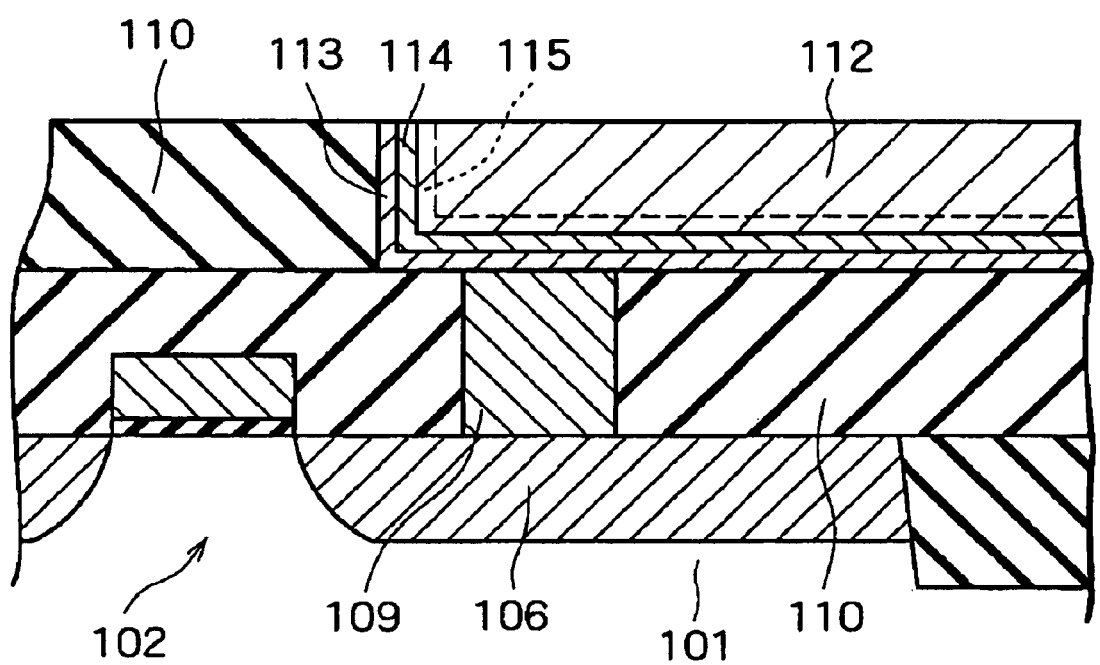

Thereafter, as shown in FIG. 3C, the Cu plating film 116 (in this case, the film 116 is depicted as including the Cu seed film 115), the Ta barrier film 114 and the TaN barrier film 113 are polished to make the surfaces of those films together with the surface of the second interlayer insulation film 110 flattened, thereby forming a first interconnect layer 112 whose surface is being flattened. Note that when polishing the above-mentioned films by using a CMP method, usually an SiN film (silicon nitride film), not shown herein, is previously formed to a specific film thickness on the surface of the second interlayer insulation film 110 as a CMP stopper film. However, in the embodiment, explanation of the SiN film is omitted for simplicity.

Figure 3D:
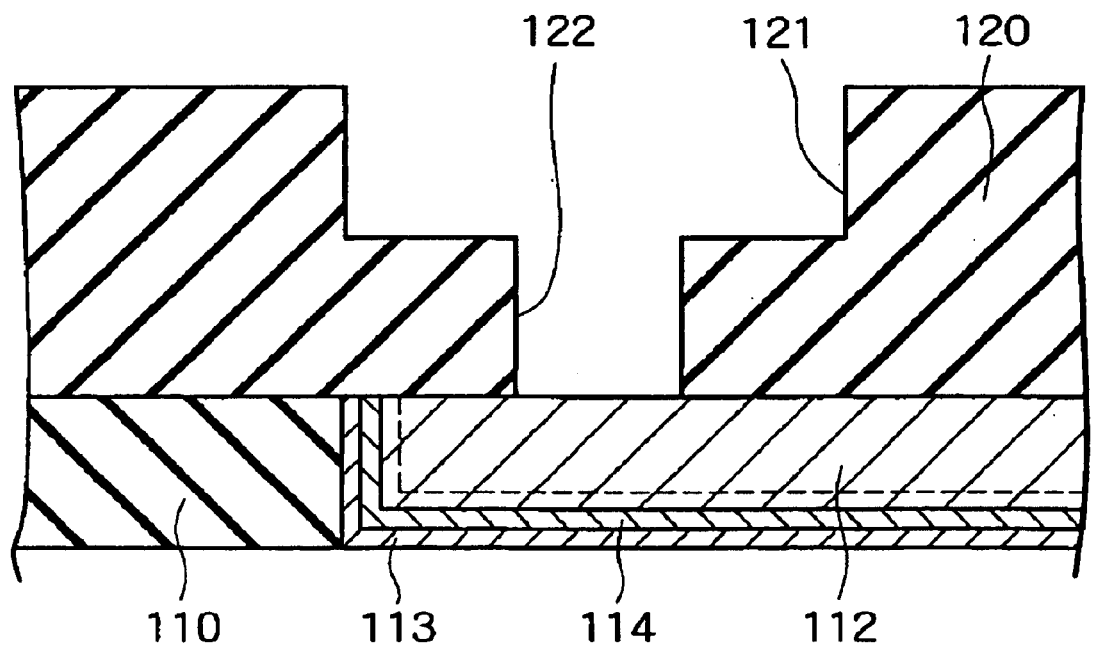

Subsequently, as shown in FIG. 3D, a third interlayer insulation film 120 made of a silicon oxide film is formed to a film thickness of about 600 nm on the second interlayer insulation film 110 and the first interconnect layer 112, and then, a second interconnect trench 121 having a specific pattern and a depth of about 300 nm below the surface of the third interlayer insulation film 120 is formed in the third interlayer insulation film 120 by a photolithography technique employing a photoresist, not shown herein. Furthermore, a via hole 122 is formed in one or more portions of the bottom surface of the second interconnect trench 121 to thereby expose the surface of the first interconnect layer 112. In this case, the second interconnect trench 121 is formed to have a width of a small dimension that has to be achieved when manufacturing the semiconductor device and a diameter of the via hole 122 is designed to be a value of about 100 to 200 nm, extremely shorter than the width of the second interconnect trench 121.

Figure 3E:
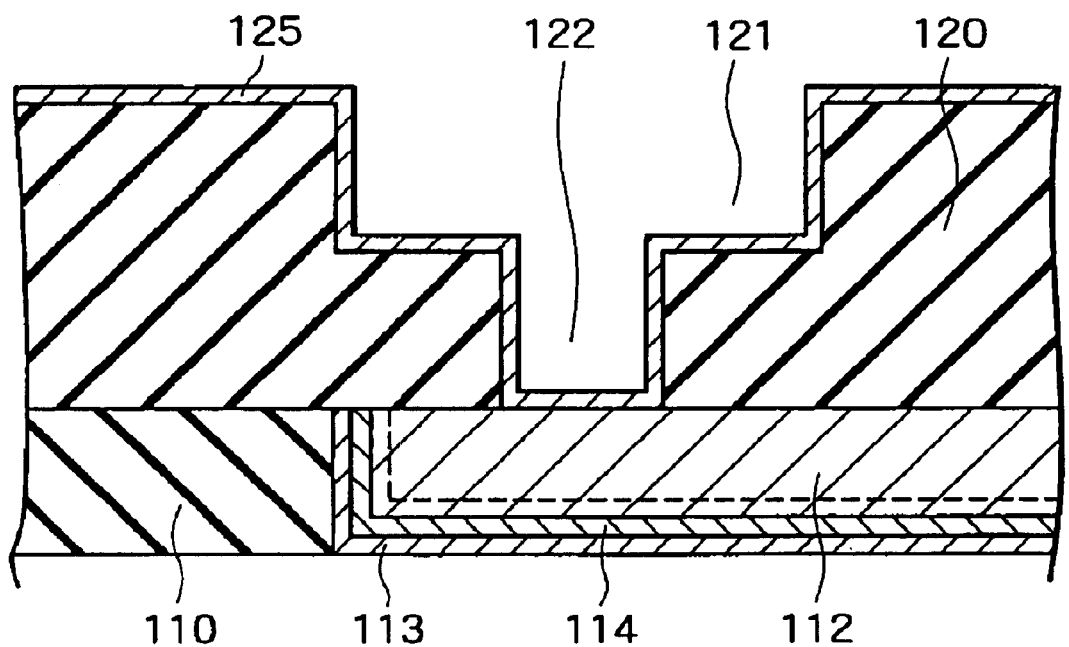

After that, as shown in FIG. 3E, a TaN barrier film 125 is deposited to a film thickness of 10 to 20 nm on an entire surface of the substrate by a sputtering method. In this case, as described above, the via hole 122 is formed to have an opening of a small dimension and an aspect ratio, i.e., a ratio of the depth of the via hole to the diameter thereof, ranging from about 1.5 to 5, and therefore, the deposited TaN barrier film 125 is formed thinner on the bottom surface of the via hole than on the side surface thereof. In the embodiment, the TaN barrier film 125 is formed to a film thickness of about 5 to 10 nm on the bottom surface of the via hole.

Figure 3F:
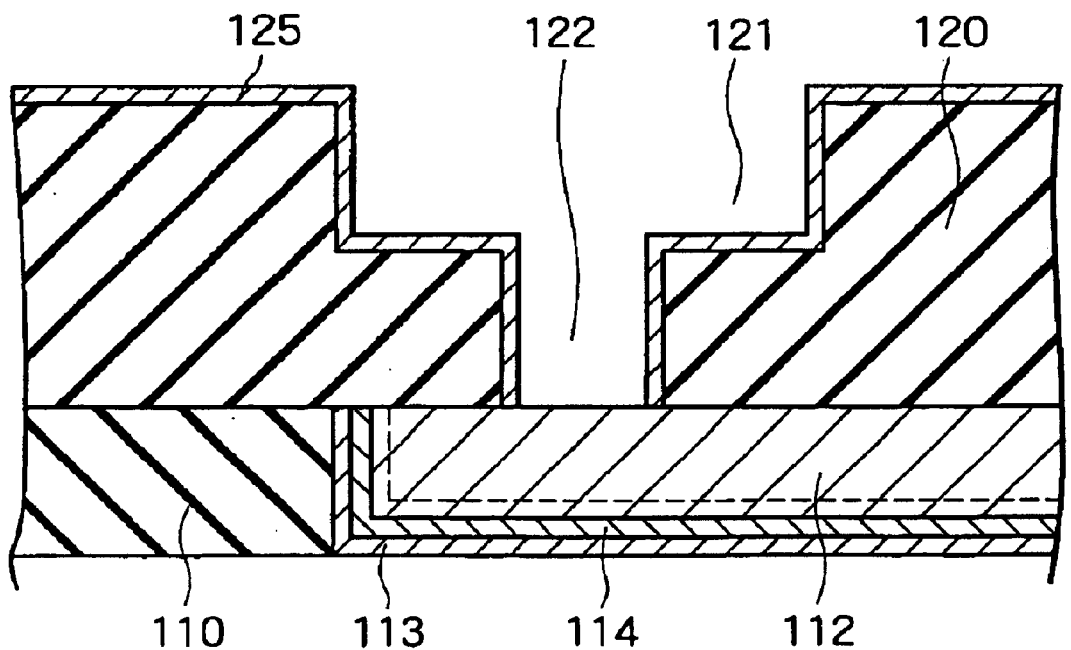

Thereafter, as shown in FIG. 3F, when the TaN barrier film 125 is dry-etched, the TaN barrier film 125 having a thin film thickness and formed on the bottom surface of the via hole 122 is etched and removed earlier than the remaining portion of TaN barrier film 125 to thereby expose the surface of the first interconnect layer 112 at the bottom surface of the via hole 122, which situation is determined as a point when the etching operation is to be stopped. At this point, the TaN barrier film 125 remains on the side surface of the via hole 122 and on the bottom surface and the side surface of the second interconnect trench 121.

Figure 3G:
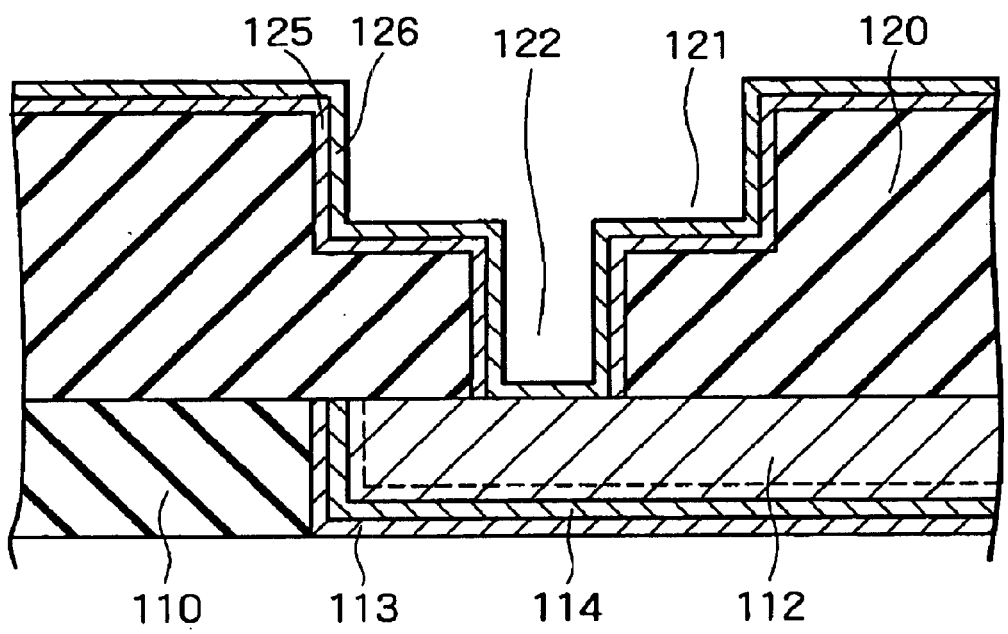

Subsequently, as shown in FIG. 3G, a Ta barrier film 126 is deposited to a film thickness of 10 to 20 nm by a sputtering method on an entire surface of the substrate including the inner surfaces of the second interconnect trench 121 and the via hole 122.

Figure 3H:
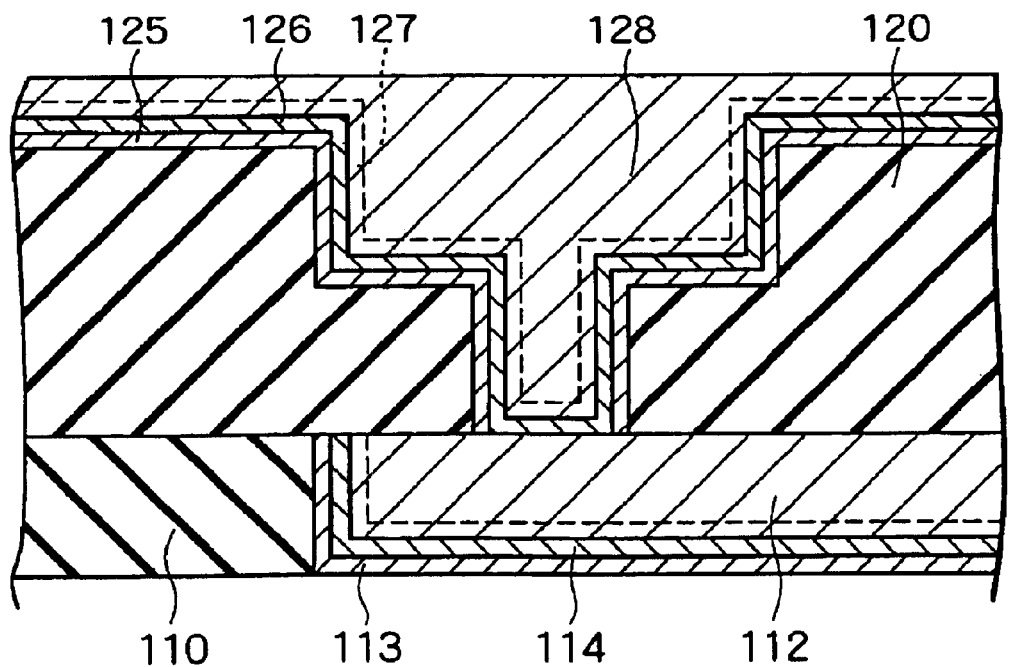

Moreover, as shown in FIG. 3H, a Cu seed film 127 denoted by a dashed line is deposited thereon by a sputtering method. Then, Cu plating is carried out using a plating method with the aid of the Cu seed film 127 to thereby form a Cu plating film 128, which completely covers at least the second interconnect trench 121 and the via hole 122, on the Cu seed film 127.

Figure 3I:
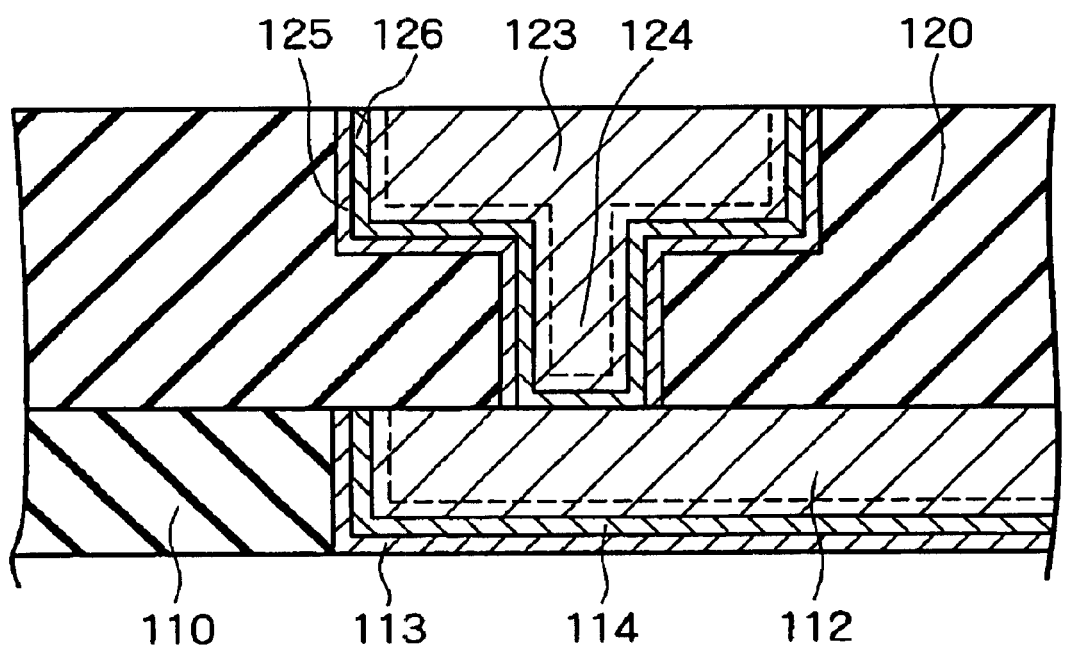

After that, the Cu plating film 128 (in this case, the film 128 is depicted as including the Cu seed film 127), the Ta barrier film 126 and the TaN barrier film 125 are polished by a CMP method in this order to make the surfaces of those films together with the surface of the third interlayer insulation film 120 flattened, thereby forming a second interconnect layer 123 whose surface is being flattened and a Cu via 124 thereunder, as shown in FIG. 3I. Note that when polishing the above-mentioned films by using a CMP method, usually an SiN film is previously formed on the surface of the third interlayer insulation film as a CMP stopper film, which construction is the same as that explained in the description of formation of the first interconnect layer. However, also in this case, explanation of the SiN film is omitted for simplicity. Subsequently, a fourth interlayer insulation film 130 shown in FIG. 2B and a third interconnect layer (not shown) are formed thereon. However, explanation of those components is also omitted for simplicity.

As described above, the dual damascene structure of the first embodiment is constructed such that a laminated barrier film (Ta/TaN) consisting of the Ta barrier film 126 and the TaN barrier film 125 resides on the side and bottom surfaces of the second interconnect layer 123 made of Cu and the side surface of the Cu via 124 that provides electrical connection between the first interconnect layer 112 made of Cu and other components, and in addition, only the Ta barrier film 126 as a single layer resides on the bottom surface of the Cu via 124. Such construction of dual damascene produces the following advantages: Ta and Cu are adherently bonded to each other at the side and bottom surfaces of the second interconnect layer 123 and the side surface of the Cu via 124; and, TaN and a silicon oxide film are adherently bonded to each other; and further, Ta and TaN are adherently bonded to each other; and therefore, adherence between a silicon oxide film and Cu, i.e., between the third interlayer insulation film 120 and a Cu structure consisting of the second interconnect layer 123 and the Cu via 124 is enhanced. This construction of dual damascene prevents diffusion of Cu contained in the second interconnect layer 123 and the Cu via 124 into the third interlayer insulation film 120 even when thermal stress is being imparted to the semiconductor device and further, prevents short circuit between a certain interconnect layer in problem and adjacent interconnect layer next to the certain interconnect layer, and damage to elements next to the certain interconnect layer, resulting in prevention of occurrence of so-called Cu contamination.

When focusing our eyes on the bottom surface of the Cu via 124, the following critical feature will be found in the embodiment. That is, only the Ta barrier film 126 resides on the bottom surface of the Cu via 124 that is adherently bonded to the first interconnect layer 112 to provide electrical connection between the first interconnect layer 112 and other components, and the TaN barrier film that resides on the bottom surface of the Cu via of the conventional dual damascene structure never resides on the bottom surface of the Cu via 124. Accordingly, firm adherence between Ta and Cu makes adherence between the first interconnect layer 112 and the Cu via 124 enhanced and even when a certain current is made passing through the Cu via 124 to the first interconnect layer 112, Cu atoms never move along an interface between the Ta barrier film 126 and the first interconnect layer 112 to resultantly maintain firm adherence therebeween, thereby providing an advantageous dual damascene structure in which resistance against electro-migration and thermal stress is high, and further, contact resistance is low.

It should be noted that as is shown in the description of the above-mentioned method for manufacturing a dual damascene, in the steps shown in FIGS. 3E, 3F for depositing the TaN barrier film 125, the TaN barrier film 125 is formed thin on the bottom surface of the via hole 122 by a sputtering method with the aid of the high aspect ratio via hole 122. In this case, for example, employment of oblique sputtering method makes it possible to make a film thickness of the TaN barrier film 125 on the bottom surface of the via hole 122 extremely thin compared to those on surfaces thereof other than the bottom surface thereof. Alternatively, it is also possible to deposit the TaN barrier film 125 by using an improved bias sputtering method so as to rarely form the TaN barrier film 125 on the bottom surface of the via hole 122. Particularly, when employing the improved bias sputtering method, a step for etching and removing the TaN barrier film 125 formed on the bottom surface of the via hole 122 becomes unnecessary, advantageously reducing the manufacturing cost.

Figure 4:
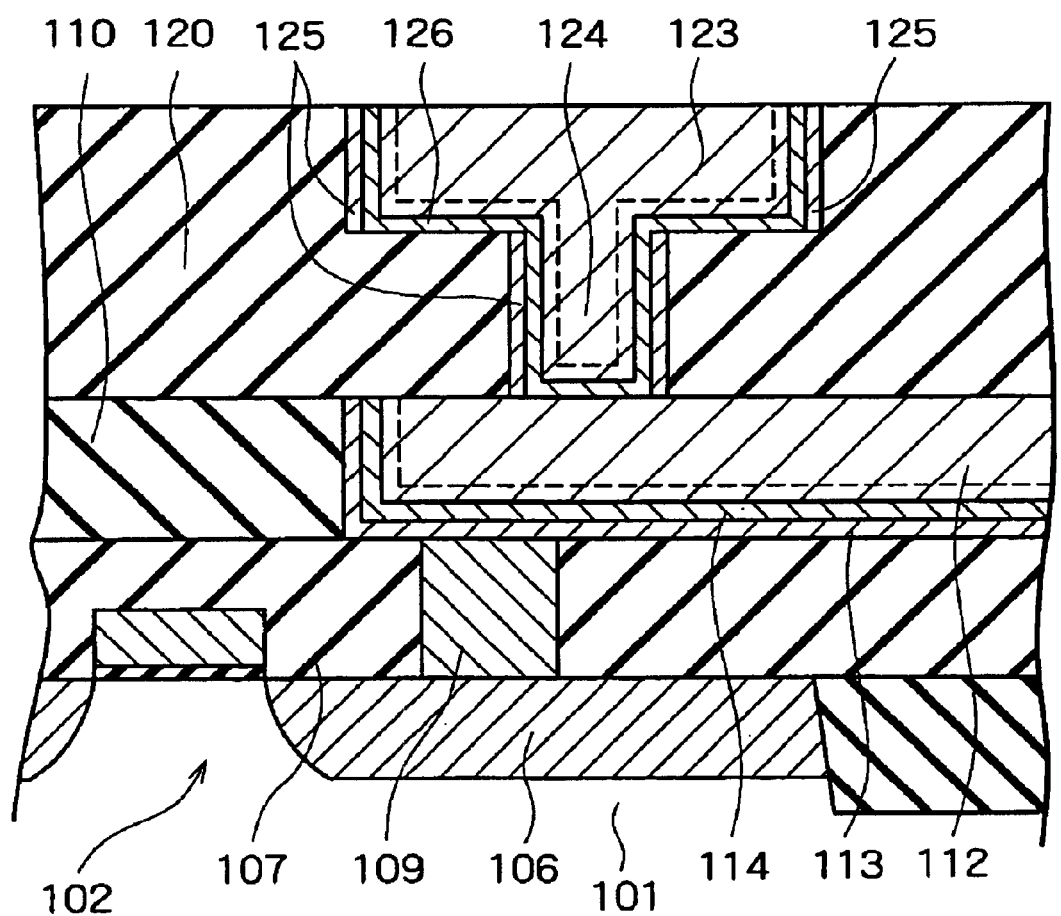
FIG. 4 is a plan view of a semiconductor device of a second embodiment of the present invention.

FIG. 4 is a cross sectional view of a dual damascene structure constructed in accordance with a second embodiment of the present invention and the parts and components used in the second embodiment and also used in the first embodiment are denoted by the same numerals as those referred in the first embodiment. In the embodiment, only a Ta barrier film 126 as a single layer is formed under a Cu via 124, which construction is the same as that of the first embodiment, and in addition, only the Ta barrier film 126 as a single layer is formed under the bottom surface of a second interconnect layer 123, i.e., on the bottom surface of a second interconnect trench 121. On each of the side surfaces of the second interconnect layer 123 and the Cu via 124 is formed a laminated film consisting of the TaN barrier film 125 and the Ta barrier film 126, which construction is the same as that of the first embodiment. The configuration of the second embodiment is effected, in particular, in the case where a low aspect ratio via hole is employed in a dual damascene structure.

Figure 5A:
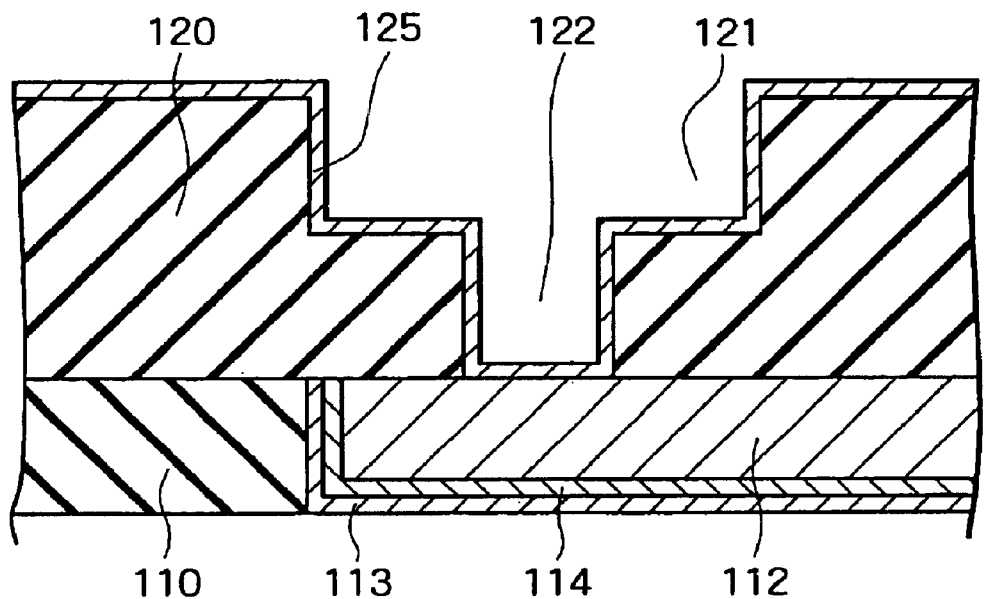
FIGS. 5A through 5C each are cross sectional views of the semiconductor device of the second embodiment, illustrating a method for manufacturing the semiconductor device in the order of manufacturing steps.
Figure 5B:
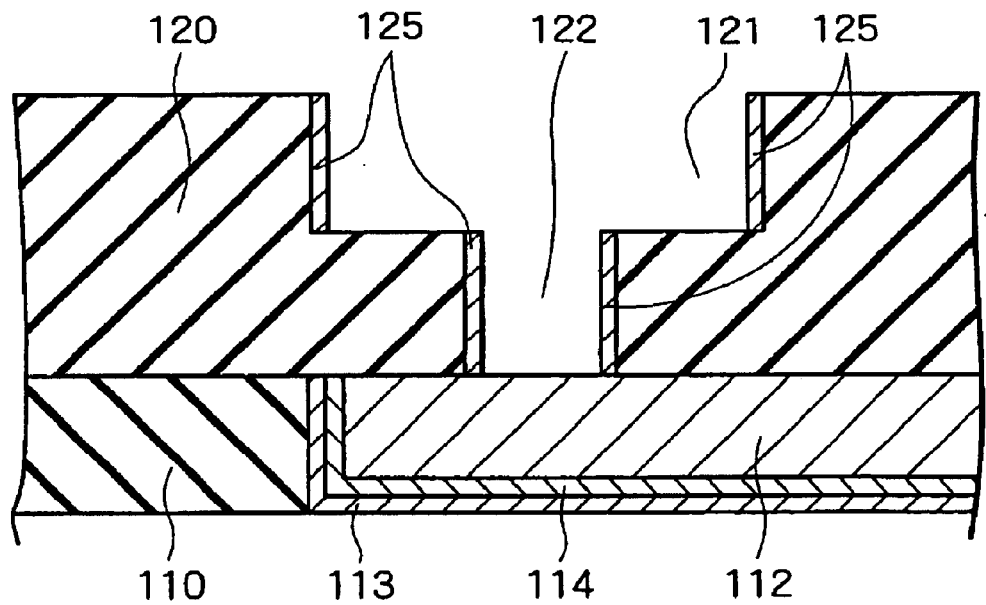
Figure 5C:
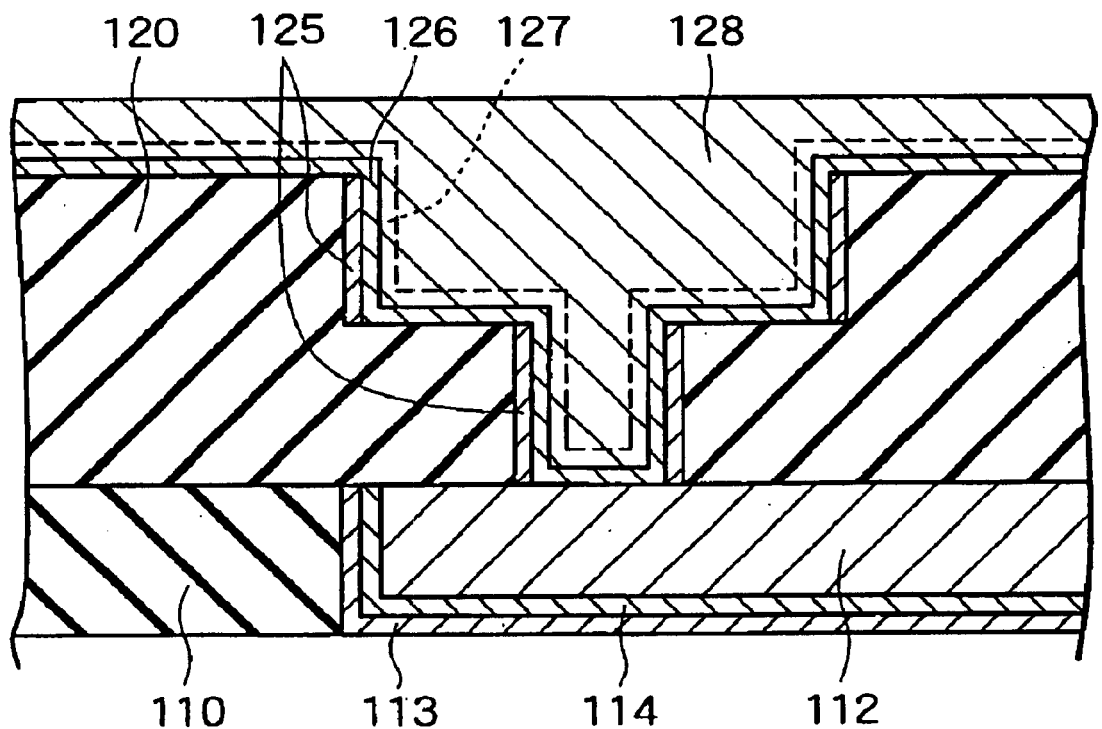

FIGS. 5A through 5C are primary and enlarged cross sectional views illustrating the semiconductor device constructed in accordance with the second embodiment and shown in the order of the steps for manufacturing the semiconductor device. As is the case with the step shown in FIG. 3D and referred in the description of the first embodiment, after a third interlayer insulation film 120 is deposited and a second interconnect trench 121 and a via hole 122 is formed therein, a TaN barrier film 125 is deposited on an entire surface of a silicon substrate by a sputtering method. Since the aspect ratio of the via hole 122 is lower than that employed in the first embodiment, the TaN barrier film 125 thus formed has a profile such that the film thickness of the TaN barrier film 125 on the bottom surface of the via hole 122 is substantially the same as that on other surfaces (i.e., the side and bottom surfaces of the second interconnect trench 121 and the side surface of the via hole 122) except for the bottom surface thereof. Under such conditions, an anisotropic etching is carried out with respect to the TaN barrier film 125, as shown in FIG. 5B, to etch and remove the TaN barrier film 125 that is positioned on the surface of the third interlayer insulation film 120 and the bottom surfaces of the second interconnect trench 121 and the via hole 122, thereby leaving the TaN barrier film 125 on the side surfaces of the second interconnect trench 121 and the via hole 122.

After that, as shown in FIG. 5C and in accordance with the steps similar to those performed in the first embodiment, a Ta barrier film 126 is deposited on an entire surface of the substrate by a sputtering method and a Cu seed film 127 is deposited thereon by a sputtering method, and then, a Cu plating film 128 is formed by a Cu plating method with the aid of the Cu seed film 127 to cover the via hole 122 and the second interconnect trench 121. Thereafter, the Cu plating film 128 (in this case, the film 128 is depicted as including the Cu seed film 127) and the Ta barrier film 126 are polished to make the surface of the substrate flattened by using a CMP method and leave the Cu plating film 128 only within the second interconnect trench 121 and the via hole 122, thereby forming a second interconnect layer 123 and a Cu via 124. Thus, the second interconnect layer 123 and the Cu via 124 each has a laminated barrier film consisting of the TaN barrier film 125 and the Ta barrier film 126 formed on their side surfaces, and only the Ta barrier film 126 as a single layer formed under their bottom surfaces.

In the second embodiment, since the laminated barrier film consisting of the TaN barrier film 125 and the Ta barrier film 126 covers respectively the side surfaces of the second interconnect layer 123 and the Cu via 124, and the Ta barrier film 126 covers the bottom surface of the second interconnect layer 123, diffusion of Cu atoms contained in the second interconnect layer 123 and the Cu via 124 into the third interlayer insulation film 120 is prevented, thereby preventing Cu contamination. Furthermore, the TaN barrier film does not reside on the bottom surface of the Cu via 124 that is in contact with the first interconnect layer 112 and only the Ta barrier film 126 as a single layer resides thereon. Accordingly, adherence between the first interconnect layer 112 and the Cu via 124 is enhanced to increase resistance against electro-migration and thermal stress, and further, make contact resistance therebetween low. Note that since only the Ta barrier film 126 as a single layer is formed under the bottom surface of the second interconnect layer 123, it would appear that adherence between the second interconnect layer 123 and the third interlayer insulation film 120 at the bottom surface thereof is lowered. However, since the laminated barrier film consisting of the TaN barrier film 125 and the Ta barrier film 126 exists around the bottom surface thereof while serving as a protective film when a CMP method is performed, polishing slurry rarely enters through the side surface to the bottom surface of the second interconnect layer 123 and mechanical stress is rarely imparted to the bottom surface of the second interconnect layer 123, thereby preventing removal of the second interconnect layer 123.

Figure 6:
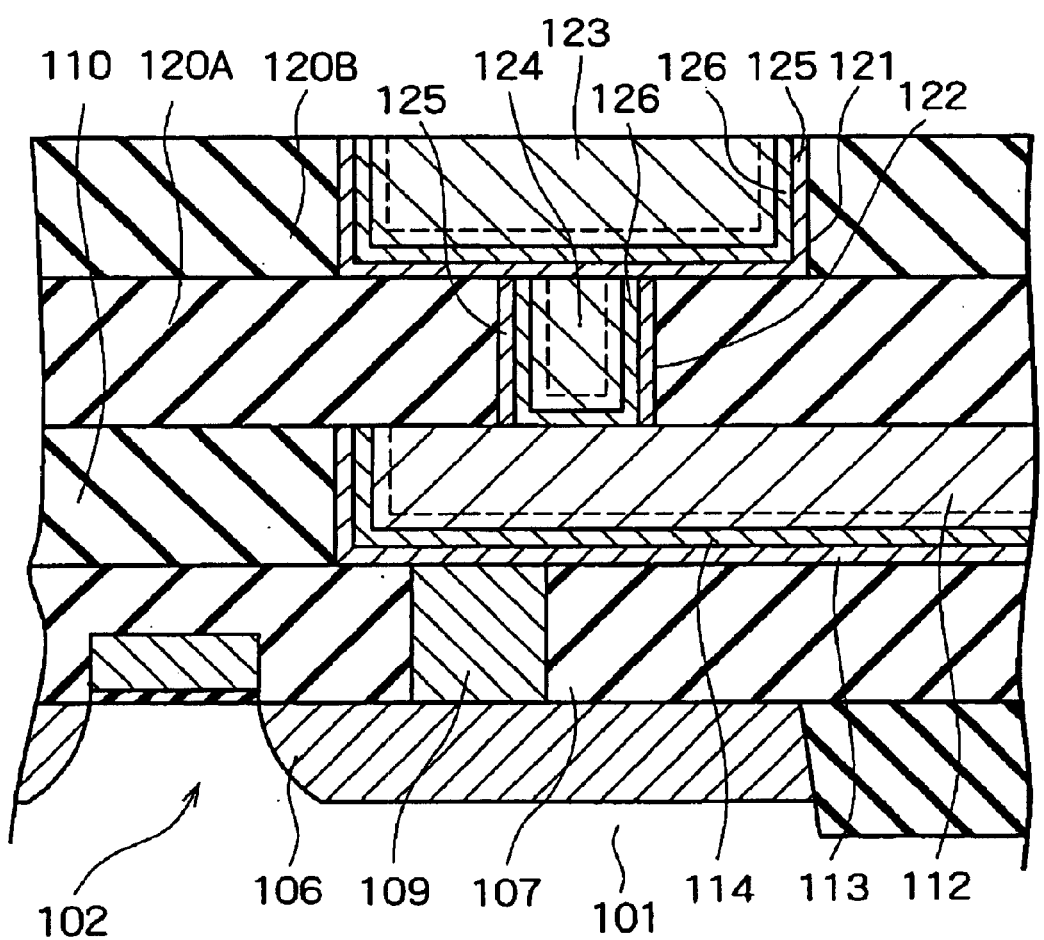
FIG. 6 is a plan view of a semiconductor device of a third embodiment of the preset invention.

FIG. 6 is a cross sectional view of a single damascene structure constructed in accordance with a third embodiment of the present invention. A first interconnect layer 112 is formed in the same manner as that employed in the first embodiment and a via hole 122 is formed in a portion of a third lower interlayer insulation film 120A, which is formed on the first interconnect layer 112, to provide electrical connection between the first interconnect layer 112 and other components, and then, Cu is formed within the via hole 122 to thereby form a Cu via 124. A third upper interlayer insulation film 120B is formed thereon and a second interconnect trench 121 is formed in the interlayer insulation film 120B, and then, Cu is formed within the second interconnect trench 121 to form a second interconnect layer 123 constituting a single damascene structure. In this case, a laminated barrier film consisting of a TaN barrier film 125 and a Ta barrier film 126 is formed on the side surface of the Cu via 124 and the Ta barrier film 126 is formed under the bottom surface thereof. Furthermore, the laminated barrier film consisting of the TaN barrier film 125 and the Ta barrier film 126 is formed on the side surface of the second interconnect layer 123 and under the bottom surface thereof.

Figure 7A:
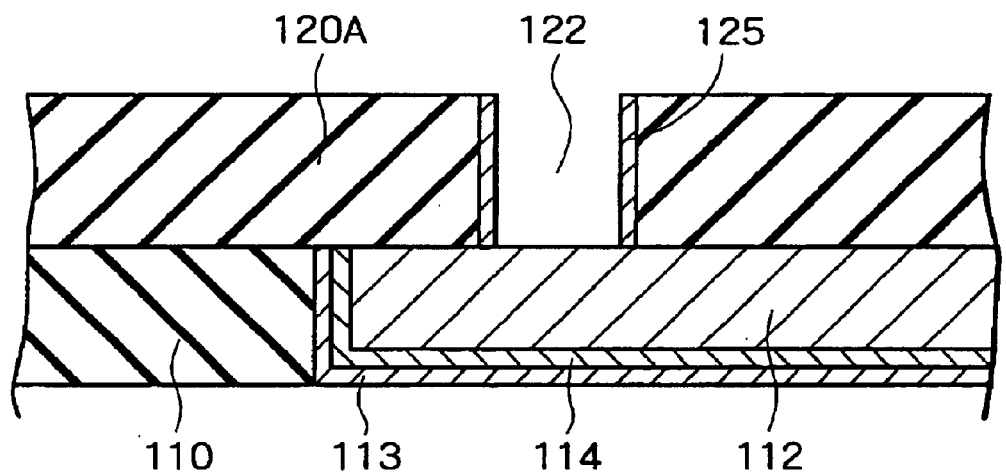
FIGS. 7A through 7E each are cross sectional views of the semiconductor device of the third embodiment, illustrating a method for manufacturing the semiconductor device in the order of manufacturing steps.

The semiconductor device of the third embodiment is manufactured as follows: as shown in FIG. 7A, a third lower interlayer insulation film 120A is formed on a first interconnect layer 112; and a via hole 122 is formed in the third upper interlayer insulation film 120A by a photolithography technique to expose the upper surface of the first interconnect layer 112; and then, a TaN barrier film 125 is deposited on an entire surface of a silicon substrate by a sputtering method; and further, the TaN barrier film 125 is etched by anisotropic etcing to remove the TaN barrier film 125 formed on the bottom surface of the via hole 122 while leaving the TaN barrier film 125 only on the side surface thereof.

Figure 7B:
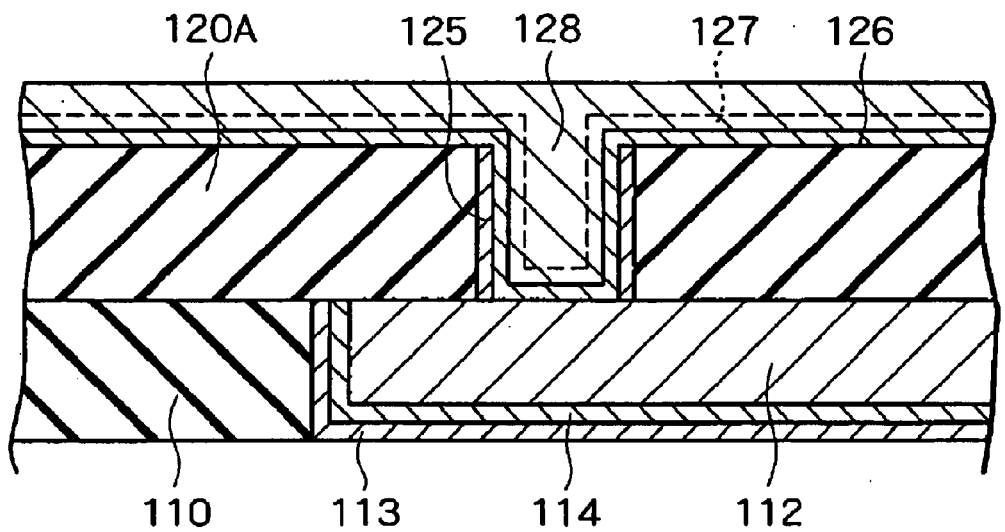

Subsequently, as shown in FIG. 7B, a Ta barrier film 126 is deposited on an entire surface of the substrate by a sputtering method and then, a Cu seed film 127 deposited thereon by a sputtering method, and further, a Cu plating film 128 is formed by a Cu plating method to a film thickness thicker than the depth of the via hole 122 with the aid of the Cu seed film 127.

Figure 7C:
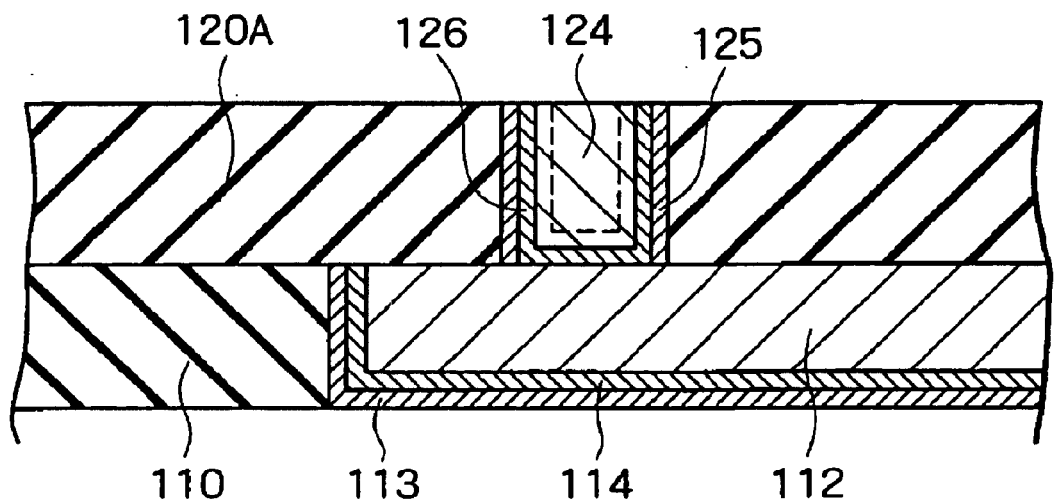

Thereafter, as shown in FIG. 7C, the Cu plating film 128 (in this case, the film 128 is depicted as including the Cu seed film 127) and the Ta barrier film 126 are polished back and removed by using a CMP method to leave the Cu plating film 128 only within the via hole 122, thereby forming a Cu via 124.

Figure 7D:
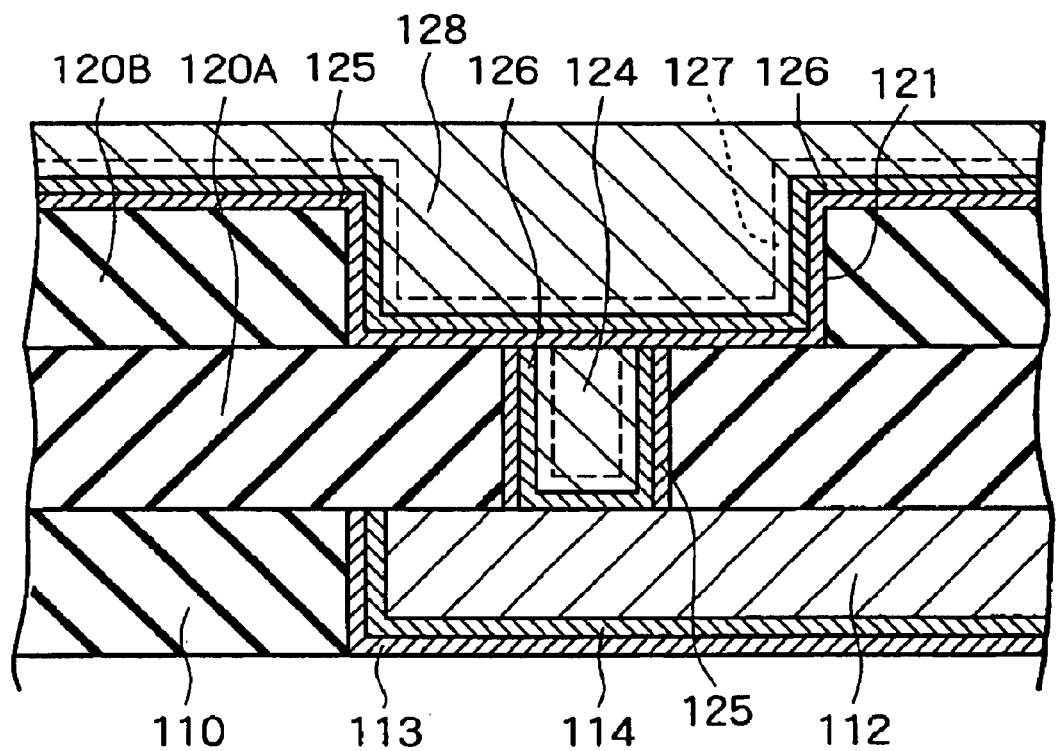

After that, as shown in FIG. 7D, a third upper interlayer insulation film 120B is formed and a second interconnect trench 121 is formed therein to a depth equal to the entire film thickness of the third upper interlayer insulation film 120B by a photolithography technique to expose the upper surface of the Cu via 124. Then, a TaN barrier film 125 and a Ta barrier film 126 are deposited in this order by a sputtering method to form a laminated barrier film consisting of the TaN barrier film 125 and the Ta barrier film 126, and a Cu seed film 127 is deposited thereon by a sputtering method, and further, a Cu plating film 128 is formed by a Cu plating method to a film thickness thicker than the depth of the second interconnect trench 121 with the aid of the Cu seed film 127.

Figure 7E:
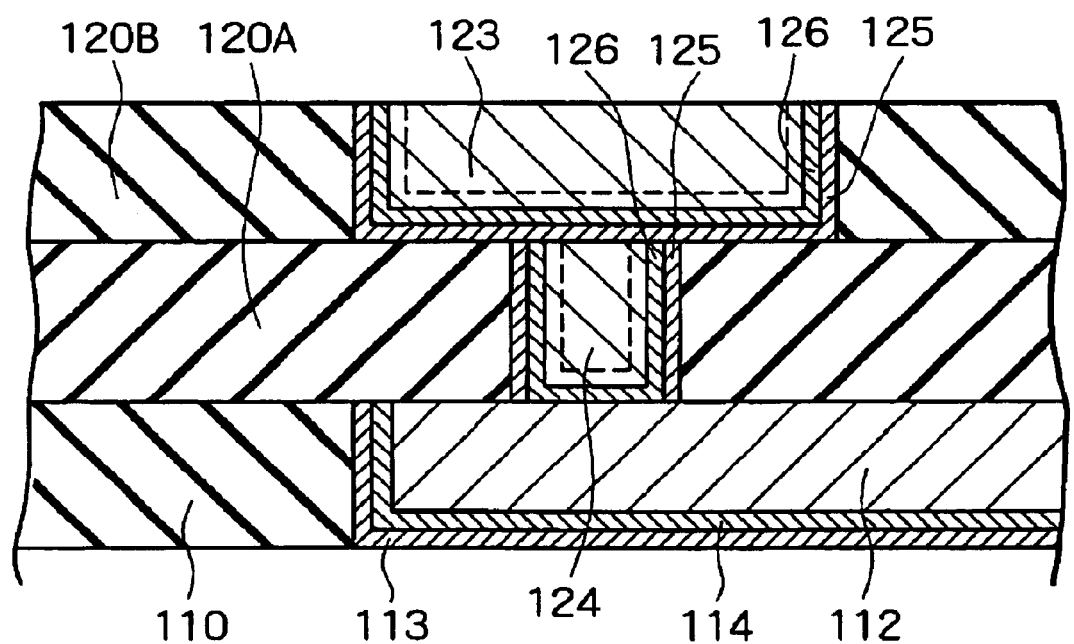

Subsequently, as shown in FIG. 7E, the Cu plating film 128 (in this case, the film 128 is depicted as including the Cu seed film 127), the Ta barrier film 126 and the TaN barrier film 125 are polished back and removed by using a CMP method to leave the Cu plating film 128 only within the second interconnect trench 121, thereby forming a second interconnect layer 123.

In the embodiment, since the laminated barrier film consisting of the TaN barrier film 125 and the Ta barrier film 126 resides on the side and bottom surfaces of the second interconnect layer 123 and on the side surface of the Cu via 124, diffusion of Cu atoms into the third lower interlayer insulation film 120A and the third upper interlayer insulation film 120B is prevented, thereby preventing Cu contamination. At the same time, adherence between Cu and each of the interlayer insulation films 120A, 120B is enhanced while preventing removal of Cu due to polishing operation performed by a CMP method or the like. In addition, since only the Ta barrier film 126 resides on the bottom surface of the Cu via 124, adherence between the first interconnect layer 112 and the Cu via 124 is enhanced, thereby increasing resistance against electro-migration and thermal stress while reducing contact resistance therebetween.

It should be noted that in the embodiment, the upper surface of the Cu via 124 contacts the bottom surface of the second interconnect layer 123 through the laminated barrier film consisting of the TaN barrier film 125 and the Ta barrier film 126, and therefore, adherence between the Cu via 124 and the second interconnect layer 123 is weakened at the portion corresponding to the laminated barrier film, which phenomenon is already explained in the description of the conventional technique. However, since the dimension of the opening of the Cu via 124 is so small, Cu atoms that move when the Cu atoms are affected by electro-migration or thermal stress can be limited only within the area the Cu via occupies and therefore, void due to the movement of the Cu atoms, i.e., deterioration in adherence between the Cu via 124 and the second interconnect layer 123 never occurs, effectively preventing increase in contact resistance therebetween.

It should be appreciated that although the above-described embodiment employs a barrier film constructed by combining Ta and TaN, the embodiment may employ a barrier film constructed by combining Ti and TiN or W and WN. That is because Ti and W each are bonded adherently to Cu, and TiN and WN each are bonded adherently to a silicon oxide film as an interlayer insulation film. Furthermore, the present invention can also be applied to the case where Cu alloy is employed as an interconnect layer and a via metal in a semiconductor device.

As described so far, a semiconductor device of the present invention is constructed such that a first barrier film adhesive to an interlayer insulation film and a second barrier film adhesive to Cu are laminated on the side surface of a Cu via, which is provided in the interlayer insulation film to connect together lower and upper interconnect layers consisting of Cu, to form a two-layered film, and the second barrier film is formed under the bottom surface of the Cu via to form a single layer film. Accordingly, those barrier films prevent Cu contamination of the semiconductor device while enhancing adherence between Cu and the interlayer insulation film at the side surface of the Cu via to prevent removal of the Cu via. Furthermore, since only the second barrier film resides on the bottom surface of the Cu via, adherence between the lower interconnect layer and the Cu via is enhanced to suppress movement of Cu atoms at an interface between the Cu via and the lower interconnect layer, thereby increasing resistance against electro-migration and thermal stress and enabling the semiconductor device to have multi-layer interconnects structure with lowered contact resistance.

What is claimed is:

1. A semiconductor device comprising:
   a lower interconnect layer formed of copper or copper alloy;
   an interlayer insulation film covering said lower interconnect layer;
   a via hole formed in said interlayer insulation film to expose a part of said lower interconnect layer;
   a copper via formed by forming copper or copper alloy within said via hole and connected to said lower interconnect layer;
   a first barrier film and a second barrier film, both being formed on a side surface of said copper via and laminated relatively to each other, said second barrier film being formed on a bottom surface of said copper via and said first barrier film not being formed on said bottom surface,
   wherein said first barrier film is on a side of said interlayer insulation film and adherence between said first barrier film and said interlayer insulation film is stronger than adherence between said first barrier film and said copper via, and said second barrier film is on a side of said copper via and adherence between said second barrier film and said copper via is stronger than adherence between said second barrier film and said interlayer insulation film,
   an upper interconnect trench formed in said interlayer insulation film on said copper via; and
   an upper interconnect layer made of copper formed within said upper interconnect trench,
   wherein said upper interconnect layer and said lower interconnect layer are connected together through said copper via, and wherein both said first and second barrier films are laminated on sides and a bottom of said upper interconnect layer other than where said upper interconnect layer contacts said copper via,
   wherein an aspect ratio of said via hole ranges from 1.5 to 5.

2. A semiconductor device comprising:
   a lower interconnect layer formed of copper or copper alloy;
   an interlayer insulation film covering said lower interconnect layer;
   a via hole formed in said interlayer insulation film to expose a part of said lower interconnect layer;
   a copper via formed by forming copper or copper alloy within said via hole and connected to said lower interconnect layer;
   a first barrier film and a second barrier film, both being formed on a side surface of said copper via and laminated relatively to each other, said second barrier film being formed on a bottom surface of said copper via and said first barrier film not being formed on said bottom surface,
   wherein said first barrier film is on a side of said interlayer insulation film and adherence between said first barrier film and said interlayer insulation film is stronger than adherence between said first barrier film and said copper via, and said second barrier film is on a side of said copper via and adherence between said second barrier film and said copper via is stronger than adherence between said second barrier film and said interlayer insulation film,
   an upper interconnect trench formed in said interlayer insulation film on said copper via; and
   an upper interconnect layer made of copper formed within said upper interconnect trench,
   wherein said upper interconnect layer and said lower interconnect layer are connected together through said copper via, and wherein both said first and second barrier films are laminated on sides and a bottom of said upper interconnect layer other than where said upper interconnect layer contacts said copper via,
   wherein any one of sets of a TaN film and a Ta film, a TiN film and a Ti film, a WN film and a W film corresponds to a set of said first barrier film and said second barrier film.

3. A semiconductor device comprising:
   a lower interconnect layer formed of copper or copper alloy;
   an interlayer insulation film covering said lower interconnect layer;
   a via hole formed in said interlayer insulation film to expose a part of said lower interconnect layer;
   a copper via formed by forming copper or copper alloy within said via hole and connected to said lower interconnect layer;
   a first barrier film and a second barrier film, both being formed on a side surface of said copper via and laminated relatively to each other, said second barrier film being formed on a bottom surface of said copper via and said first barrier film not being formed on said bottom surface,
   wherein said first barrier film is on a side of said interlayer insulation film and adherence between said first barrier film and said interlayer insulation film is stronger than adherence between said first barrier film and said copper via, and said second barrier film is on a side of said copper via and adherence between said second barrier film and said copper via is stronger than adherence between said second barrier film and said interlayer insulation film,
   an upper interconnect trench formed in said interlayer insulation film on said copper via; and
   an upper interconnect layer made of copper formed within said upper interconnect trench,
   wherein said upper interconnect layer and said lower interconnect layer are connected together through said copper via, and wherein both said first and second barrier films are laminated on sides and a bottom of said upper interconnect layer other than where said upper interconnect layer contacts said copper via,
   wherein said first barrier film and said second barrier film each is formed to a film thickness of 10 to 20 nm.

4. A semiconductor device comprising:

a lower interconnect layer formed of copper or copper alloy;

an interlayer insulation film covering said lower interconnect layer;

a via hole formed in said interlayer insulation film to expose a part of said lower interconnect layer;

a copper via formed by forming copper or copper alloy within said via hole and connected to said lower interconnect layer;

a first barrier film and a second barrier film, both being formed on a side surface of said copper via and laminated relatively to each other, said second barrier film being formed on a bottom surface of said copper via and said first barrier film not being formed on said bottom surface, said first barrier film being positioned on a side of said interlayer insulation film and adherence between said first barrier film and said interlayer insulation film being stronger than adherence between said first barrier film and said copper via, said second barrier film being positioned on a side of said copper via and adherence between said second barrier film and said copper via being stronger than adherence between said second barrier film and said interlayer insulation film;

an upper interconnect trench formed in said interlayer insulation film on said copper via; and an upper interconnect layer made of copper formed within said upper interconnect trench, wherein said upper interconnect layer and said lower interconnect layer are connected together through said copper via, said upper interconnect layer and said copper via form one-piece structure consisting of copper to thereby constitute a dual damascene structure, only said second barrier film is formed in a connection region for connecting said lower interconnect layer and said copper via together, and said first and second barrier films are being laminated in a contact region for making said interlayer insulation film and a copper region consisting of said upper interconnect layer and said copper via contact each other, said contact region being defined as a region other than said connection region.

5. A semiconductor device comprising:

a lower interconnect layer formed of copper or copper alloy;

an interlayer insulation film covering said lower interconnect layer;

a via hole formed in said interlayer insulation film to expose a part of said lower interconnect layer;

a copper via formed by forming copper or copper alloy within said via hole and connected to said lower interconnect layer;

a first barrier film and a second barrier film, both being formed on a side surface of said copper via and laminated relatively to each other, said second barrier film being formed on a bottom surface of said copper via and said first barrier film not being formed on said bottom surface, said first barrier film being positioned on a side of said interlayer insulation film and adherence between said first barrier film and said interlayer insulation film being stronger than adherence between said first barrier film and said copper via, said second barrier film being positioned on a side of said copper via and adherence between said second barrier film and said copper via being stronger than adherence between said second barrier film and said interlayer insulation film;

an upper interconnect trench formed in said interlayer insulation film on said copper via; and an upper interconnect layer made of copper and formed within said upper interconnect trench, wherein said upper interconnect layer and said lower interconnect layer are connected together through said copper via, said upper interconnect layer and said copper via are constructed by forming one-piece structure consisting of copper as a dual damascene structure, only said second barrier film is formed under each of bottom surfaces of said upper interconnect layer and said copper via, and said first and second barrier films are being laminated on each of side surfaces of said upper interconnect layer and said copper via.

6. A semiconductor device comprising:

a lower interconnect layer formed of copper or copper alloy;

an interlayer insulation film covering said lower interconnect layer;

a via hole formed in said interlayer insulation film to expose a part of said lower interconnect layer;

a copper via formed by forming copper or copper alloy within said via hole and connected to said lower interconnect layer; and a first barrier film and a second barrier film, both being formed on a side surface of said copper via and laminated relatively to each other, said second barrier film being formed on a bottom surface of said copper via and said first barrier film not being formed on said bottom surface, said first barrier film being positioned on a side of said interlayer insulation film and adherence between said first barrier film and said interlayer insulation film being stronger than adherence between said first barrier film and said copper via, said second barrier film being positioned on a side of said copper via and adherence between said second barrier film and said copper via being stronger than adherence between said second barrier film and said interlayer insulation film, wherein any one of sets of a TaN film and a Ta film, a TIN film and a Ti film, a WN film and a W film corresponds to a set of said first barrier film and said second barrier film.

7. A semiconductor device comprising:

a lower interconnect layer formed of copper or copper alloy;

an interlayer insulation film covering said lower interconnect layer;

a via hole formed in said interlayer insulation film to expose a part of said lower interconnect layer;

a copper via formed by forming copper or copper alloy within said via hole and connected to said lower interconnect layer; and a first barrier film and a second barrier film, both being formed on a side surface of said copper via and laminated relatively to each other, said second barrier film being formed on a bottom surface of said copper via and said first barrier film not being formed on said bottom surface, said first barrier film being positioned on a side of said interlayer insulation film and adherence between said first barrier film and said interlayer insulation film being stronger than adherence between said first barrier film and said copper via, said second barrier film being positioned on a side of said copper via and adherence between said second barrier film and said copper via being stronger than adherence between said second barrier film and said interlayer insulation film, wherein said first barrier film and said second barrier film each is formed to a film thickness of 10 to 20 nm.

8. A semiconductor device comprising:

a lower interconnect layer formed of copper or copper alloy;

an interlayer insulation film covering said lower interconnect layer;

a via hole formed in said interlayer insulation film to expose a part of said lower interconnect layer;

a copper via formed by forming copper or copper alloy within said via hole and connected to said lower interconnect layer, and a first barrier film and a second barrier film, both being formed on a side surface of said copper via and laminated relatively to each other, said second barrier film being formed on a bottom surface of said copper via and said first barrier film not being formed on said bottom surface, said first barrier film being positioned on a side of said interlayer insulation film and adherence between said first barrier film and said interlayer insulation film being stronger than adherence between said first barrier film and said copper via, said second barrier film being positioned on a side of said copper via and adherence between said second barrier film and said copper via being stronger than adherence between said second barrier film and said interlayer insulation film, wherein said first barrier film and said second barrier film each is formed to a film thickness of 10 to 20 nm, wherein any one of sets of a TaN film and a Ta film, a TiN film and a Ti film, a WN film and a W film corresponds to a set of said first barrier film and said second barrier film.

9. The device according to claim 4, wherein an aspect ratio of said via hole ranges from 1.5 to 5.

10. The device according to claim 5, wherein an aspect ratio of said via hole ranges from 1.5 to 5.

11. The device according to claim 6, wherein an aspect ratio of said via hole ranges from 1.5 to 5.

12. The device according to claim 7, wherein an aspect ratio of said via hole ranges from 1.5 to 5.

* * * * *